(12) United States Patent
Goodyear et al.

(10) Patent No.: US 7,822,494 B2
(45) Date of Patent: Oct. 26, 2010

(54) METHOD FOR GENERATING AND USING A PLASMA PROCESSING CONTROL PROGRAM

(75) Inventors: Andrew Leonard Goodyear, Clevedon (GB); Philip Douglas Rossbrook, Clevedon (GB)

(73) Assignee: Oxford Instruments Plasma Technology Limited, Abingdon (GB)

( * ) Notice: Subject to any disclaimer, the term of this patent is extended or adjusted under 35 U.S.C. 154(b) by 48 days.

(21) Appl. No.: 11/919,125

(22) PCT Filed: Apr. 25, 2006

(86) PCT No.: PCT/GB2006/001490

§ 371 (c)(1),
(2), (4) Date: Feb. 19, 2009

(87) PCT Pub. No.: WO2006/114595

PCT Pub. Date: Nov. 2, 2006

(65) Prior Publication Data

US 2009/0216342 A1    Aug. 27, 2009

(30) Foreign Application Priority Data

Apr. 28, 2005 (GB) ................................. 0508706.9

(51) Int. Cl.
| G05B 19/42 | (2006.01) |
| G05B 11/01 | (2006.01) |
| G06F 9/44 | (2006.01) |
| G05B 15/00 | (2006.01) |
| C23F 1/00 | (2006.01) |
| H01L 21/306 | (2006.01) |
| H01L 21/00 | (2006.01) |

(52) U.S. Cl. ............................ 700/86; 700/17; 700/18; 700/83; 700/87; 700/181; 717/105; 717/106; 717/110; 156/345.24; 156/345.35; 438/5

(58) Field of Classification Search ............. 700/17–18, 700/83, 86–87, 181; 717/105, 106, 110; 156/345.24, 345.35; 438/5
See application file for complete search history.

(56) References Cited

U.S. PATENT DOCUMENTS

| 6,051,503 | A | | 4/2000 | Bhardwaj et al. |
| 6,077,386 | A | * | 6/2000 | Smith et al. ............. 156/345.24 |
| 6,079,426 | A | * | 6/2000 | Subrahmanyam et al. .... 134/1.1 |
| 6,189,482 | B1 | * | 2/2001 | Zhao et al. ............... 118/723 R |
| 6,358,573 | B1 | * | 3/2002 | Raoux et al. ................ 427/578 |
| 6,417,013 | B1 | * | 7/2002 | Teixeira et al. .................. 438/5 |
| 6,516,237 | B1 | | 2/2003 | Aoki et al. |
| 6,603,538 | B1 | * | 8/2003 | Oluseyi et al. ................ 356/72 |
| 6,650,957 | B1 | | 11/2003 | Campbell et al. |
| 6,774,570 | B2 | * | 8/2004 | Tsuchiya et al. ........ 315/111.21 |

(Continued)

*Primary Examiner*—Ramesh B Patel
(74) *Attorney, Agent, or Firm*—Blank Rome LLP (57) ABSTRACT

A method is provided of generating and using a control program for a obtain plasma process. The method comprises obtaining predetermined process data defining, in a series of time steps, changes in at least one control parameter for the plasma process during the said process. Control data are generated from the process data, the control data defining the at least one control parameter at a plurality of discrete times within each step. The control data are presented graphically to a user, using an interactive display device. The control data are modified in response to the operation by the user of the interactive display device, so as to generate the control program.

34 Claims, 9 Drawing Sheets

U.S. PATENT DOCUMENTS

| | | | |
|---|---|---|---|
| 6,806,438 B2* | 10/2004 | Nakano et al. | 219/121.54 |
| 2001/0034562 A1 | 10/2001 | Aumer et al. | |
| 2003/0090522 A1 | 5/2003 | Verhaar | |
| 2004/0035529 A1* | 2/2004 | Grimbergen | 156/345.24 |
| 2008/0032511 A1* | 2/2008 | Kabe et al. | 438/771 |

* cited by examiner

Figure 1

PRIOR ART

METHOD FOR GENERATING AND USING A PLASMA PROCESSING CONTROL PROGRAM

The present invention relates to a method of generating a control program for a plasma process, plasma processing using such a program and associated apparatus.

Plasma-based processing typically involves evacuating a process chamber in which a substrate such as a wafer to be processed, is mounted. Process gases are then introduced into the process chamber, and the chamber pressure is stabilised to a certain process pressure, usually by control of a throttle valve in the pumping arrangement. RF (radio frequency) power is applied to one or more electrodes in the chamber (or other plasma sources connected to the chamber) to create a plasma and to apply electrical bias (if necessary) to the wafer or certain other parts of the chamber. Typically, this results in the desired etching and/or deposition at the wafer surface.

Accurate control of the process parameters (e.g. gas flows, pressure, RF power levels, electrode temperature(s), wafer cooling helium pressure, chamber wall temperature, and so on) is critical to control the desired process results (such as etch or deposition rates, etch selectivities between materials, etch profiles, deposited film quality, uniformity across wafer and so on).

A typical process program (also known as a "recipe") comprises several individual process steps (each with its own set of process conditions) rather than a single process step. This added complexity is usually necessary to achieve a "fine tuning" of the process results. Typical simple examples requiring multi-step programs are as follows:

Aluminium Etching:
Step 1) Native oxide (or other surface contaminant layer) removal step using high RF power to achieve a high DC bias at the wafer surface, combined with a high flow of reducing agents within the gas mixture;
Step 2) Main etch with process conditions optimised for fast etching, good profile control, good selectivity to mask layers and good uniformity; and
Step 3) Etch through to underlying oxide, using process conditions optimised for good selectivity to underlying oxide.

Silicon Etching:
Repeated cycles of step A and step B (often referred to as the "Bosch" process)
Step A) C4F8 based polymer deposition step for sidewall passivation; and
Step B) SF6 based silicon etch step.

There may be several groups of repeated cycles with differing process conditions optimised at each stage of the etch for good profile control throughout.

Plasma Enhanced Chemical Vapour Deposition (PECVD) of Silicon Dioxide:
Step 1) Wafer pre-heat step;
Step 2) Surface cleaning/film adhesion improvement step; and
Step 3) Main SiO2 PECVD step.

The stepwise nature of these types of processes is consistent with the process requirements, since at certain stages within the processing, the process conditions must change to a new set of conditions to achieve the desired process result.

This is also consistent with the accepted industry standard method of programming these types of multi-step programs, that is, each step is programmed as a separate set of process conditions, the data being stored electronically on a computer or programmable control system. At the end of each step the process conditions for the next step are called up and applied to the process chamber control components.

Various modifications have been made to the example processes described above. One such example is disclosed in U.S. Pat. No. 6,051,503 in which the values of certain parameters such as gas flow rates, chamber pressure, plasma power and so on are modified as a function of time.

U.S. Pat. No. 6,417,013 also describes the modification of parameter values. In this case, the parameter values are varied according to a specific envelope function over time. The parameter values throughout the recipe therefore adopt the general shape of the function chosen.

Whilst the above-described techniques to date have provided good results in plasma processes, as these techniques are developed, there is an increasing need to provide greater flexibility and more accurate control over the processes.

In accordance with a first aspect of the present invention we provide a method of generating a control program for a plasma process, the method comprising:
a) obtaining predetermined process data defining, in a series of time steps, changes in at least one control parameter for the plasma process during the said process;
b) generating control data from the process data, the control data defining the at least one control parameter at a plurality of discrete times within each step;
c) presenting the control data graphically to a user, using an interactive display device; and
d) modifying the control data in response to the operation by the user of the interactive display device, so as to generate the control program.

The present invention represents a significant leap forward in the generation of control programs for plasma processes. These programs are now no longer required to be limited by the prior stepwise limitations which have been inherent within prior art program recipes to date. Advantageously, the present invention is however backwardly compatible with such program recipes, this being beneficial because such recipes are widespread and used in a large number of different plasma processing operations with different materials.

Step a) of the method allows such a prior art recipe (as stepwise process data) to be obtained and the program according to the invention is then generated from this by converting the process data to program data which controls the respective parameter(s) at a number of times within each step itself. This new style of program also provides a program designer (user) with an opportunity to exact a very fine degree of control over the program data. For example, whereas in the past a prior art process step would have been defined by a parameter value and a time duration, with the present invention, fine adjustments may be made to the parameter within the step itself by the provision of the plurality of program data points as a function of time within the time step. According to the invention, these may be conveniently modified by the user due to the provision of an interactive display device for making such modifications.

As will be appreciated, a large number of control parameters are required to fully control a plasma process. Typical parameters include temperature, gas flow and so on. Parameters of various types may be controlled simultaneously by the program.

We have also realised that, whilst others in the art have focussed upon the variation of the step values themselves, the transition between the steps is important for improved process control. This is because by considering such transitions, the system can be used in a manner which takes into account the system limitations.

In the past, changing between steps has been effected by either:

1) a complete break, such as evacuation of the process chamber before introducing the process gases for the next step. This can result in longer overall process times due to the extra time required to fully evacuate the chamber and re-stabilise gases; or
2) an immediate changeover of conditions, for example, with the RF power applied continuously throughout. This is faster but can lead to several undesirable problems, including unstable plasmas, extinguishing of the plasma and unexpected process results due to poor combination of process conditions during the transitions. For this reason, typically the time steps defined by the process data are separated by discontinuities in the data, such that the data itself actually requires instantaneous changeover between particular parameter conditions.

In order to control such transitions during the process itself, it is first recognised that such transitions should preferably be controlled over a non-instantaneous period. It will be appreciated that various transition behaviours can therefore be defined.

Step b) according to the invention therefore preferably further comprises defining a transition period between adjacent steps and generating control data from the process data for the transition period, the control data defining values of the at least one control parameter at one of more discrete times between each step during the transition period. By placing control data points within the times of the transitions, the degree of control over the adjacent steps can be much improved. Preferably therefore step d) allows the users to modify such control data within the transition period(s). As will be appreciated, where such transition periods are provided, they must have a finite length.

The provision of finite transition periods between steps of a predetermined length, may of course cause the length of the process program as a whole to increase. If this is undesirable, then the length of one or each step in the adjacent steps may be reduced by an amount equal to the transition period so as to maintain the total length of the series of steps in the original recipe.

The steps of the process remain defined since in most plasma processes, more than one parameter is controlled in a stepwise manner, making the steps easily identifiable. The steps could be of constant length although typically they are not constant throughout the process in question.

Typically the interactive display device displays the process data as a graph of the parameter in question on a first axis and time upon a second axis. This allows the recipe obtained in step a) to be displayed. Typically the interactive device also displays the generated control data as a graph of the parameter of a first axis and time on a second axis. Preferably the control data are plotted as points upon the respective graph and the user then modifies the graph by selecting and moving the points to desired positions. The control data is then re-calculated accordingly to form the output control program for the plasma process. This allows each individual control data point to be specifically positioned by the user, either within steps themselves or in transition periods between steps.

The user may also select a group of two or more adjacent control data points and fit these to a particular predetermined function such as to a line or curve. Such a line can be selected from a predetermined number of such functions. It is also envisaged that the initial definition of the plurality of discrete times in step b) may be assisted by the user.

Whilst the predetermined process data may be obtained from a suitable storage device, it is also anticipated that the interactive display device itself may be used to generate the process data itself, for example using a prior art method, this process data then being obtained in step a) for use in the remainder of the method according to the invention. In some processes such as for silicon etching, a stepwise recipe can be generated by the repetition of a small number of steps or the repetition of the groups of such steps. This can be performed as part of the generation of the data which is then obtained in step a). Such a repetition technique can also be applied where transitions are desired to be formed between certain steps.

It is anticipated therefore that the process values for each step may in many cases be programmed in the traditional stepwise fashion for ease of programming, but then modified using the graphical method mentioned earlier.

We have also realised that further advantage can be gained by applying a general envelope shape to the control data representing the steps themselves, so as to provide greater control over the process.

As a result of the consideration of transitions between the steps, we have also realised that the manner in which tolerances are dealt with in performing the process can be greatly improved. Tolerance checking is a common problem in multi-step plasma process recipes. Typically this involves monitoring whether a particular parameter is sufficiently close to its set-point value at any given time. This causes problems because such parameters vary sharply. In the past this has been addressed by the use of pre-programmed tolerance levels, for example either as percentages of the parameter set point, or discrete values. Often a band is defined with upper and lower boundaries, the band containing a set point where an error signal is produced should the values fall outside those defined by the band. Unfortunately this method is rather inappropriate and insufficient, particularly for the consideration of transitional periods.

The method preferably therefore further comprises, for a given parameter, determining a permitted tolerance band related to the parameter for use in monitoring the performance of the plasma process in question. The tolerance is typically determined as a function of the response time of the apparatus used for performing the process. The permitted tolerance band may vary through the recipe. The tolerance may also be determined and/or modified by the user. Typically the method further comprises displaying the tolerance using the interactive display device which also provides a means for adjusting the tolerance in the manner desired by the user.

The values of the parameters are actually calculated and applied, based not only upon the typical parameter level tolerances of the various equipment involved but, significantly, also as a function of the known response times of the various equipment. This is important when considering transitional periods since these may be rather short. This method can also be used in the application of tolerance levels to the values within the steps themselves, particular at the boundaries between such steps and the transition period. Specifically, for rapidly changing parameters, the tolerance band may be made wider in the time axis to accommodate the response of the equipment and therefore be not simply based upon a simple percentage of the parameter level. It is particularly advantageous to display and allow the user to modify such tolerance levels.

Turning now to the control data itself, in particular where control data values are provided, the control data are preferably provided corresponding to times which are coincident with at least the start and/or finish times of each respective step. The control data are preferably regularly spaced in time, preferably by no more than 100 milliseconds. Once the control program has been defined and modified by the user, it may then be further divided into data representing specific sampling times, these preferably being regularly spaced and also preferably having a spacing in time of less than a hundred seconds, more preferably less than 10 seconds, even more preferably between 10 milliseconds and 1 second, and most preferably between 100 milliseconds and 1 second. These sampling times are provided to conform with a control device for controlling the plasma process. Such a control device is therefore adapted to provide instructions to the plasma processing apparatus at a rate corresponding to the specified sampling times. The sampling times are effectively only limited by the data transfer rate and the program storage capacity.

If the control data are provided at a similar rate, then the further division of the program into sampling times is not required.

In accordance with a second aspect of the present invention, we provide a method of plasma processing comprising:
  obtaining a plasma process control program generated using a method according to the first aspect; and,
  operating plasma processing apparatus in accordance with the control program, so as to perform a desired plasma process.

The method of plasma processing therefore implements the control program provided by the method according to the first aspect of the invention.

Plasma processing apparatus is therefore preferably controlled such that the at least one parameter is substantially in the same condition as that desired by the corresponding control program at the relevant time. This means that there is a direct correlation between the requirements of the program and the implemented parameter. There may of course exist a small lag-time due to the process dynamics.

Either of the methods according to the first or second aspect of the present invention are preferably computer-implemented, the invention also extending to include a control program having been formed by a method according to the first aspect of the invention. The invention is also intended to include a computer program comprising computer program code means adapted to perform the method according to the first aspect of the invention when the program is run on a computer, together with such a computer program embodied on a computer readable medium.

In accordance with a third aspect of the present invention, a plasma processing system is provided for performing a method according to a second aspect of the invention. The system comprises a plasma processing apparatus for plasma processing a substrate in accordance with the control program; an interactive display device for generating the control program in accordance with the user; and a control system in communication with the plasma processing apparatus for executing the control program and controlling the plasma processing apparatus so as to perform the desired plasma process.

Typically therefore the interactive display device is conveniently provided in the form of computer having an associated display and user-input device. This is typically coupled to the plasma processing apparatus. The control device preferably comprises a programmable logic controller so as to implement the instructions of the control program.

Some examples of the methods of the present invention are now described with reference to the accompanying drawings, in which.

Figure 1:
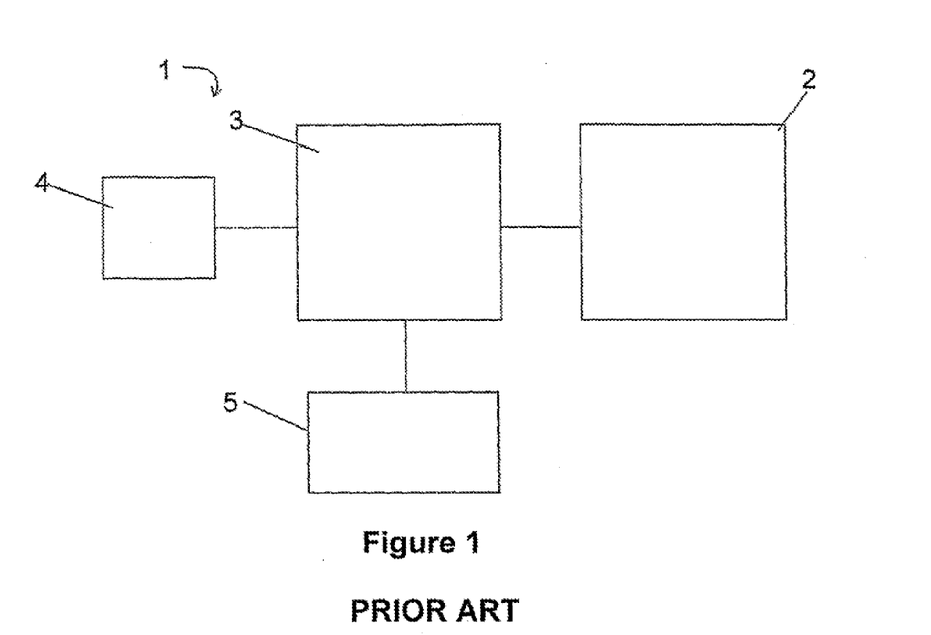
FIG. 1 is a schematic representation of plasma processing apparatus.

FIG. 1 is a schematic representation of known plasma processing apparatus, generally indicated at 1, for use in accordance with the invention. This comprises a plasma processing chamber 2 together with conventional apparatus such as vacuum pumps, gas supplies and a plasma generation unit. In the present case, the plasma chamber and respective devices are controlled using a computer 3. This has a connected display device 4 (such as a monitor) and receives commands from a user via a user interface 5. The user interfaces may take a number of forms such as a keyboard, mouse, light pen and so on, or may represent a combination of such devices.

As is known, the plasma processing apparatus 1 is controlled using the computer 3 which operates according to a stepwise plasma processing program ("recipe"). Such a program is fundamentally a series of instructions (process data) regarding the desired levels or configurations of particular process parameters as a function of time, these forming the program steps. These instructions are interpreted by the computer 3 and then the plasma chamber 2 and associated devices are operated accordingly. In most cases, a number of such parameters are controlled at any one time.

Figure 2:
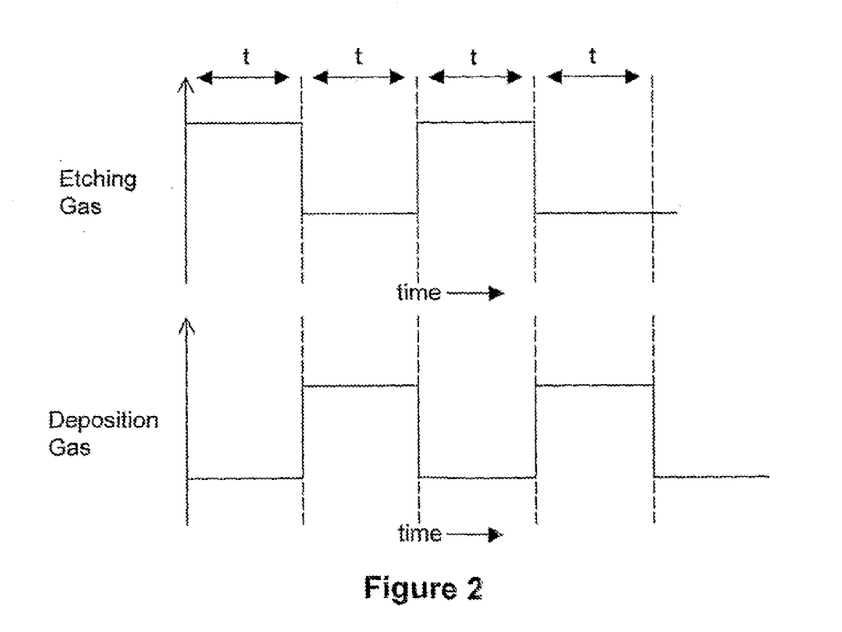
FIG. 2 illustrates values of etching and deposition gases in a known stepwise silicon etching recipe.

FIG. 2 shows a simple example of such process data for silicon etching. Two graphs are shown in FIG. 2, each having a synchronised time axis. The upper graph shows how the amount of etching gas is varied between an upper level and a lower level in a stepwise manner, whereas the lower graph shows how the deposition gas is again varied between respective upper and lower levels, also in a stepwise manner (although in antiphase to that of the etching gas). In the simple example shown in FIG. 2, four time steps, each of length "t", are illustrated.

It should be noted here and in the following description that the steps illustrated in the figures are shown as having constant lengths for clarity purposes. However in practice the steps are usually of different lengths.

The transitions between the upper and lower levels in each of these values are of infinite slope, that is, an instantaneous transfer between the values is required. Traditional recipe programs merely specify the times at which the respective parameters (etching gas, deposition gas and so on), are, required to be at particular predetermined levels. It is extremely important to note here that prior art systems provide programming for such stepped recipes merely by numerical entry of the relevant process data into specific fields. The graphs of FIG. 2 are therefore purely illustrative and they do not illustrate in any way the representation of such process data in a manner which would be familiar to a user of such a system.

In an example now described, a prior art recipe is modified in accordance with the invention so as produce an output control program for use in controlling a plasma process.

Figure 3:
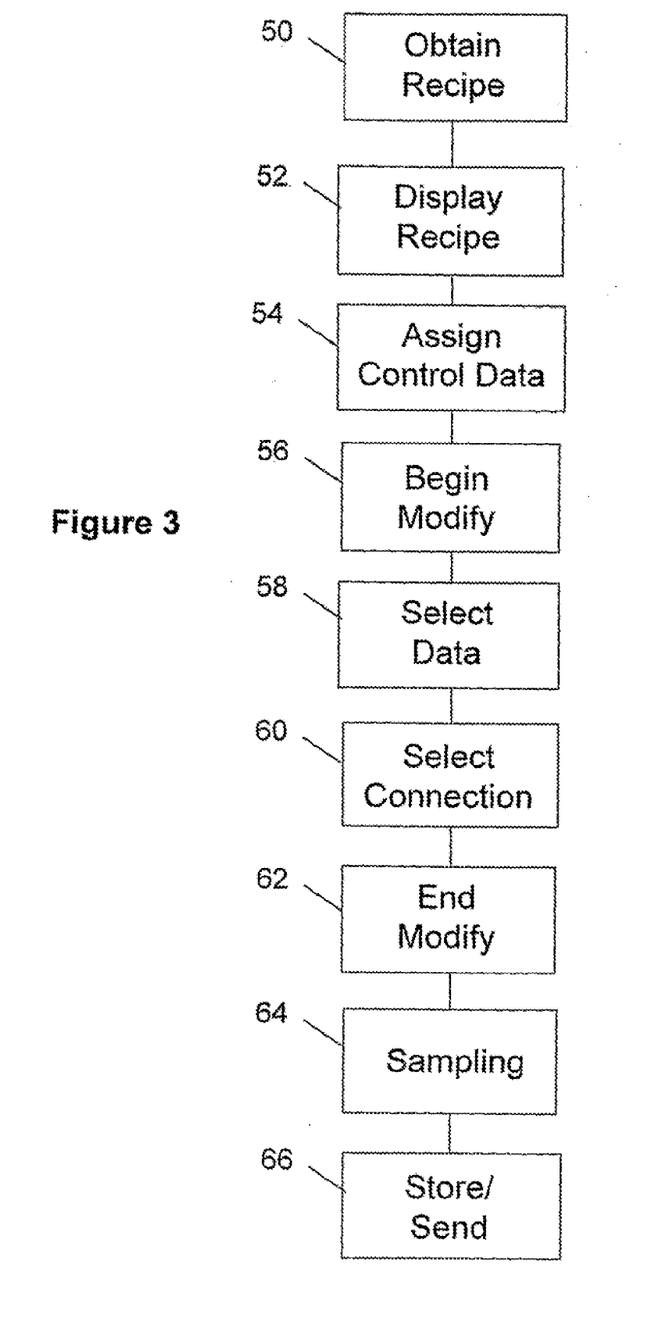
FIG. 3 is a flow diagram of a first example method of generating a plasma processing program.
Figure 4:
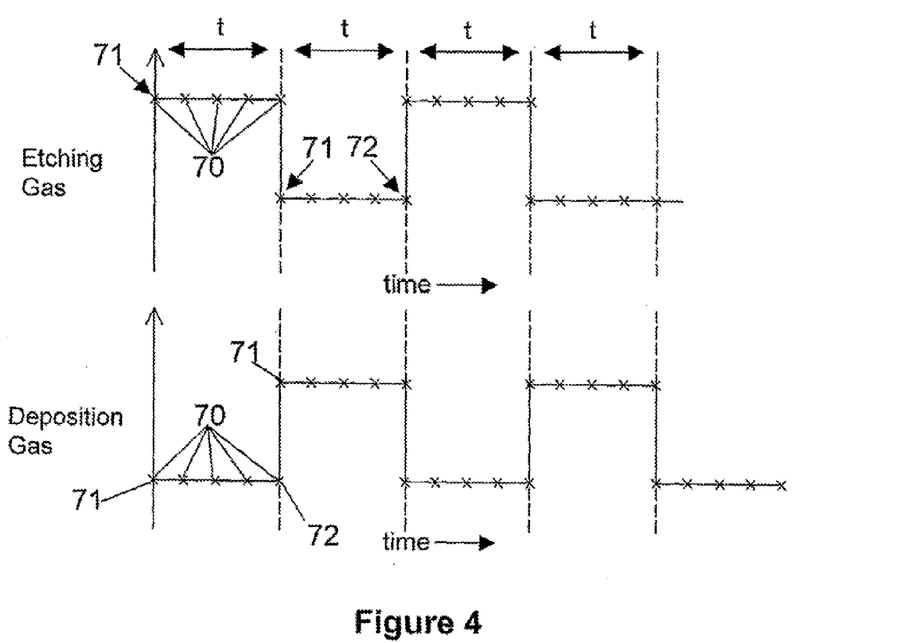
FIG. 4 illustrates control data being assigned to a plasma process recipe.

Referring to FIG. 3, computer software adapted to perform the method of the invention is executed upon the computer 3. This firstly performs the step of obtaining a recipe for silicon etching in the form of process data, this recipe being a known recipe having a stepwise set of instructions with respect to the control of etching and deposition gases as shown in FIG. 2. This recipe is obtained at step 50 in FIG. 3. At step 52, the software interprets the recipe process data and plots this as a graph as a function of time (in a similar manner to that shown in FIG. 2) for review by the user of the software. The graphs are presented to the user on the display 4. At step 54 in the method, the software then analyses the time steps of length "t" and assigns control data to represent the value (in this case) of the parameter, for each of the etching gas and deposition gas. This is shown in FIG. 4. The control data are illustrated by small crosses at 70, these including a first data point 71 and last data point 72 for each of the steps of length t. In the present case, five such data points are provided for each step. This is for illustrative purposes only. In practice, a large number of such data points can be provided for each step of length "t".

Figure 5:
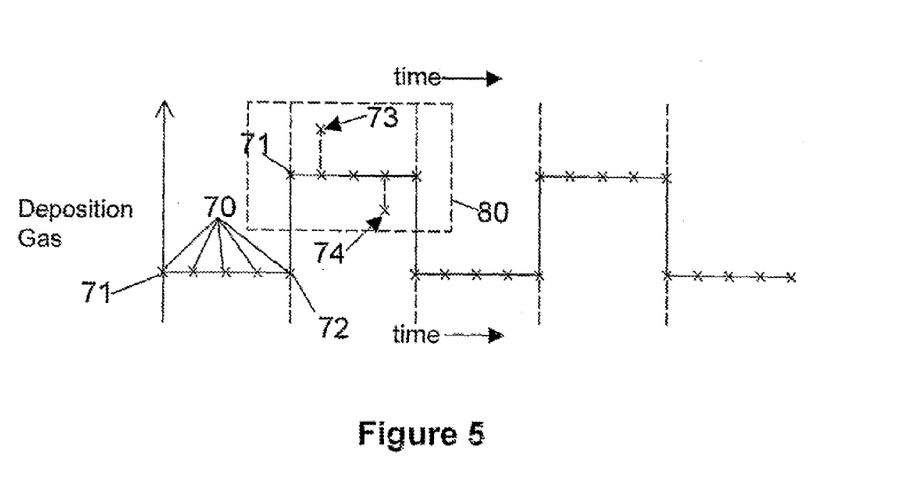
FIG. 5 illustrates the modification of the control data.

Returning to FIG. 3 at step 56 the user may modify the positions of the data points with respect to the parameter axis (etching gas or deposition gas). This is shown in FIG. 5 in which the second and fourth data point 70 along the time axis within a particular step are repositioned for the etching gas parameter, the first data points 73 being moved to a position of increased etching gas delivery, with the fourth data point being moved to a position 74 representing a smaller amount of etching gas. At step 58 in FIG. 3 the user selects a group of control data points, in this case these being each of the five points representing the particular etching gas step as illustrated by the use of the box 80. The user may therefore select a set of adjacent data points by the use of an onscreen click-and-drag action defining a box, in association with a pointer system such as a mouse.

Figure 6:
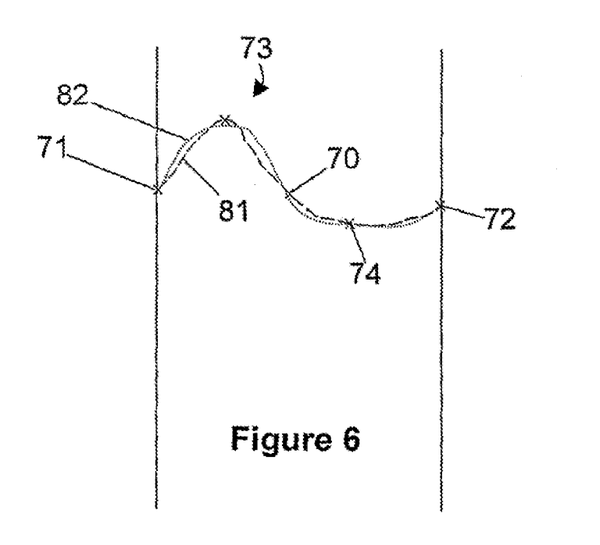
FIG. 6 shows the interconnection of the control data.

Once the data points have been selected at step 58, the user may then define how the particular control parameter is to behave between the various data points (step 60). This may be achieved by simple linear connection of the data points as a function of time, or various smoothing functions can be used. In FIG. 6, the dashed line illustrates a linear variation in the parameter between data points at 81, whereas the dotted curve at 82 shows a smoother change between the various data points 70. This connection function is selected by the user and is convenient particularly where data points are spaced in time by a relatively large amount.

Although the assigned data points 70 are regularly spaced in time, the system also may provide for the addition of further data points and indeed the removal of such data points, in which case connecting functions can also be used to determine the value of the parameter between adjacent data points. At step 62, the user finishes editing the positions of the data points.

At step 64, a time sampling step is performed. In this step, the entire plasma process with respect to each parameter is subdivided into a large number of sampled data points. The spacing in time between these data points is typically of the order of 100 milliseconds. This is typically a much smaller time period than the period between adjacent control data points. At points in time other than those coinciding with control data points, the computer software uses the connecting function in step 60 to determine the precise value of the sample data at each respective time point.

The modification by the user may occur with respect to a number of different parameters at substantially the same time, or each of these may be treated individually in sequence. Either way, the time sample data for each parameter is stored or sent to the plasma processing apparatus at step 66.

A second example is now described in which analogous steps 50 to 66 are performed with respect to the process data of the time steps, and in addition, the time steps are modified so as to provide for a controlled transition between the steps for particular parameters.

In reality it is not possible to produce an instantaneous changeover between values or configurations of parameters, and therefore the plasma processing system works hard to cause as rapid a change as possible in these parameters. Such demands unfortunately have a detrimental effect, and in particular produce undesirable side effects such as unstable plasmas, plasma extinction and unexpected results for example due to overshoot of the values.

Figure 7:
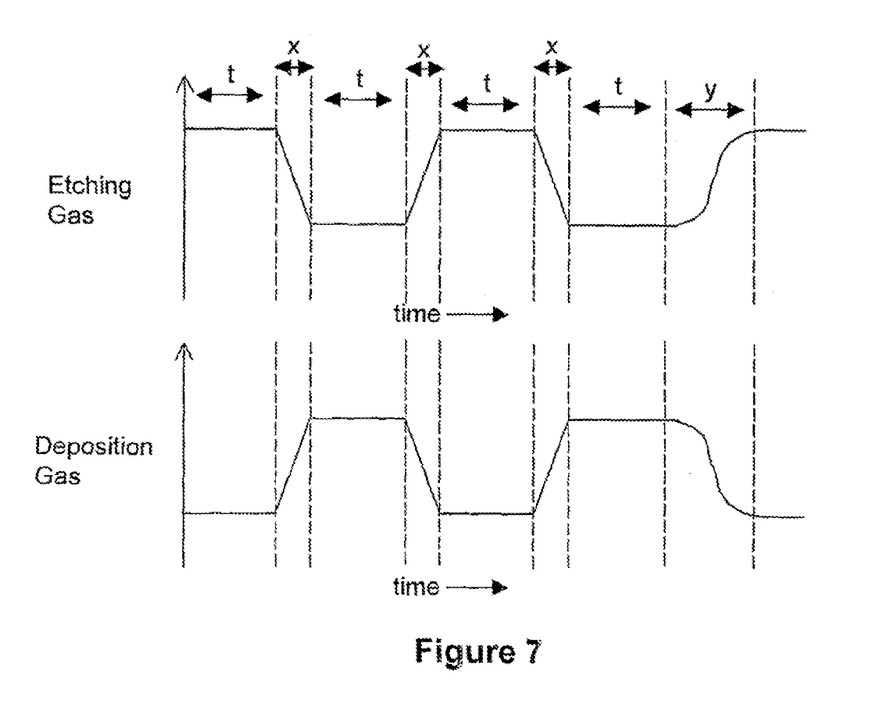
FIG. 7 shows the insertion of transitions between steps according to a second example.

FIG. 7 shows a modified recipe illustrated schematically, and corresponding to that of FIG. 2. Here, four steps, each of length t are again provided as an input with the etching and deposition gas levels illustrated. However, in this case, it can be seen that the program has been amended in that a finite transition time period "x" is provided for the transition between the values required. In the case of the first three transitions in the etching gas, it will be noted that the value of the time period x is significantly shorter than that of t, and that a linear transition is specified between the two levels. For illustrative purposes, a fourth transition is shown labelled y in which the form of the transition between the two levels is that of a sigmoid. The length of the time period y in this case is longer than that of x, although again smaller than that of t. A similar analogous antiphase program with three linear transitions and a single sigmoidal transition is shown in the deposition gas curve.

It will be understood in this case that the total length of the program is increased by the insertion of the time periods with transitions x and y. However, if the length of the program as a whole is particularly important, then a known input program comprising a number of steps t can be modified in the manner shown in FIG. 8. In this case, the input values in the program are illustrated at 10 and the values after modification are shown at 11. It will be noted here that again linear transitions are provided although in this case, the time period x of the transition itself is obtained by shortening the previous time periods t. In this case the steps on either side of the transition are shortened equally.

Figure 8:
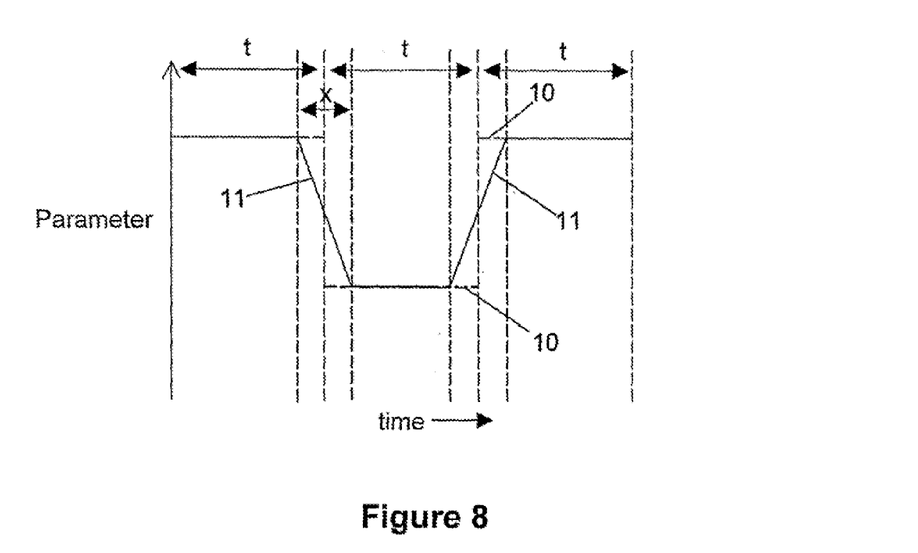
FIG. 8 shows how the total recipe length may be maintained despite the insertion of transition periods.
Figure 9:
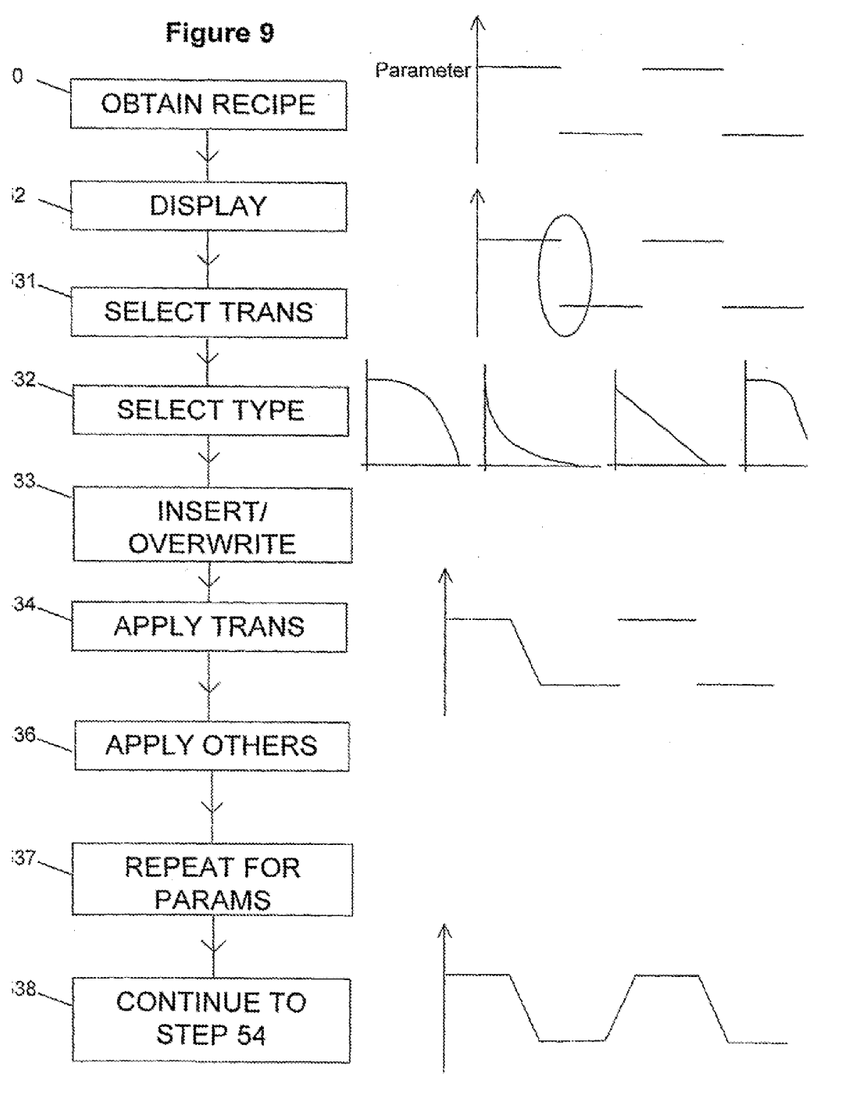
FIG. 9 is a flow diagram of a second example method including the control of transitions.

FIG. 9 is a flow diagram illustrating how a known plasma etching recipe, may be modified so as to include the transitions shown in FIGS. 7 and 8 in accordance with the second example of the invention.

A conventional recipe program is again loaded at step 50 and is displayed graphically upon the display 4 at step 52. This is shown schematically on the right hand side in FIG. 9. Prior to step 54, the following additional steps are performed. At step 531 an instantaneous transition in the known values of a particular parameter in the recipe is selected by the user, in this case, graphically (shown as an ellipse in FIG. 9). Subsequently at step 532, a type of transition to apply is selected from a predetermined number of selections (linear or various curves). Then at step 533, the length of the transition period is selected by the user, this being either for insertion within the recipe (so as to lengthen it), or to overwrite the time periods and therefore to gain time from the adjacent periods so as to maintain the length of the program in total.

At step 534 the transition in question is applied and subsequently, at step 535, steps 531 to 534 are then repeated for each of the transitions desired by the user. At step 536, the user is provided with the ability to apply. a group of transitions to either a number or all of the remaining steps. within the process. This requires a repetitive pattern within the originally loaded program, although such patterns are common in certain processes. At step 537, the process is repeated for other parameters and finally at step 538, the newly modified recipe is then ready to be subject to the. remainder of the method of FIG. 3, from step 54 onwards.

Although the modification of a known recipe is described here, it will be appreciated that in an alternative example, the entire initial recipe could be defined from the beginning, including steps and transitions, and later modified.

Figure 10:
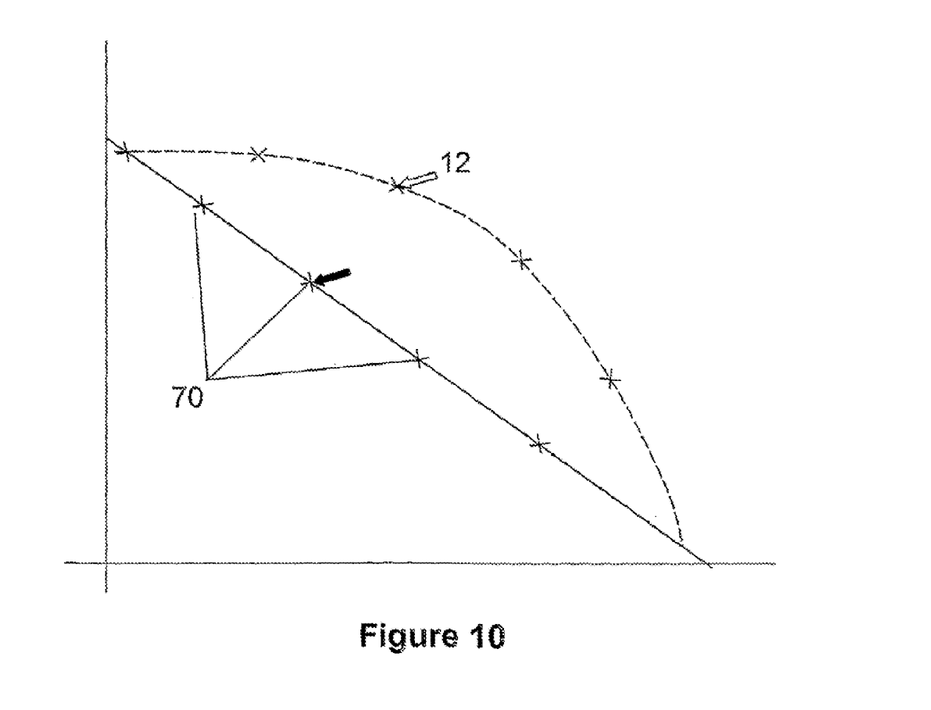
FIG. 10 is an example of the modification of the form of a predetermined transition.

Whilst step 532 provides the ability to select from one of a number of different predefined transition types, as in shown in FIG. 9, the computer 3 may be used to amend or indeed to construct from the beginning, a particular transition type. In FIG. 10 a linear transition is shown having a number of points defined along its length. As is illustrated, the mouse pointer 12 is used to select a point along the length of the line and is then used to drag the point away from the line. This process is applied to a number of points and later, a curve is fitted between them.

It is therefore possible to vary the shape of the steps and the transitions graphically. Because the original data may be entered in the traditional step-wise recipe programming format and then displayed graphically, this allows convenient use of known successful programs, making the method compatible with previous systems. A typical graph showing a selection of parameters from a 3-step process recipe is shown in FIG. 11 (in this case the parameter curves being superimposed).

Figure 11:
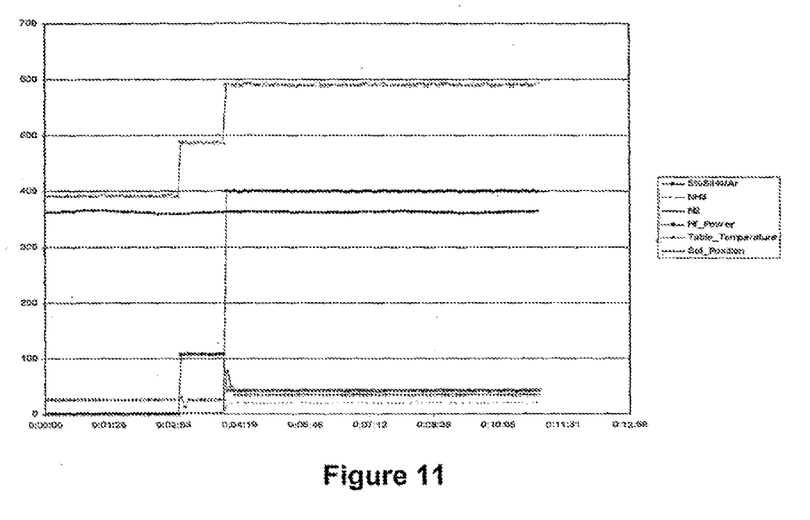
FIG. 11 shows various parameter levels as a function of time according to a control program.

FIG. 11 shows various parameters, including the amount of gases such as a 5% silane/argon mixture, ammonia, nitrogen, together with the input power level, table temperature and set position.

Figure 12:
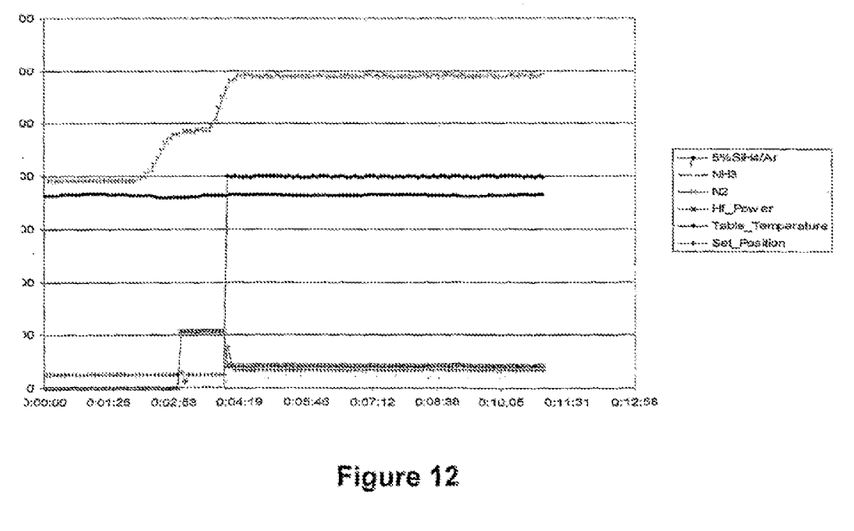
FIG. 12 shows modifications in the steps and transitions of one parameter.

In the present case, referring to FIG. 11, it may be desirable to alter the shape of the transition of a particular parameter from one step to another by any method such as clicking and dragging to a particular shape, drawing the curve freehand or using predefined curves (or indeed a combination). This is illustrated in FIG. 12 in which the upper nitrogen transitions have been smoothed.

It may in some cases be desirable to modify an envelope function to the steps as a whole within the recipe immediately after step 52, the envelope taking a particular wave form.

Figure 13:
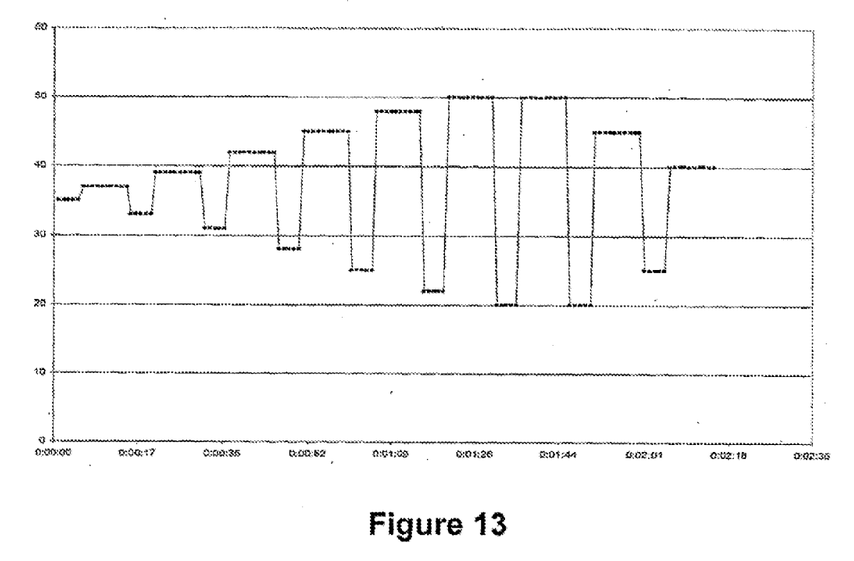
FIG. 13 shows a third example with rapid linear transitions and an applied envelope function.

An example of the application of an envelope to a series of steps in an obtained recipe is shown in FIG. 13.

Figure 14:
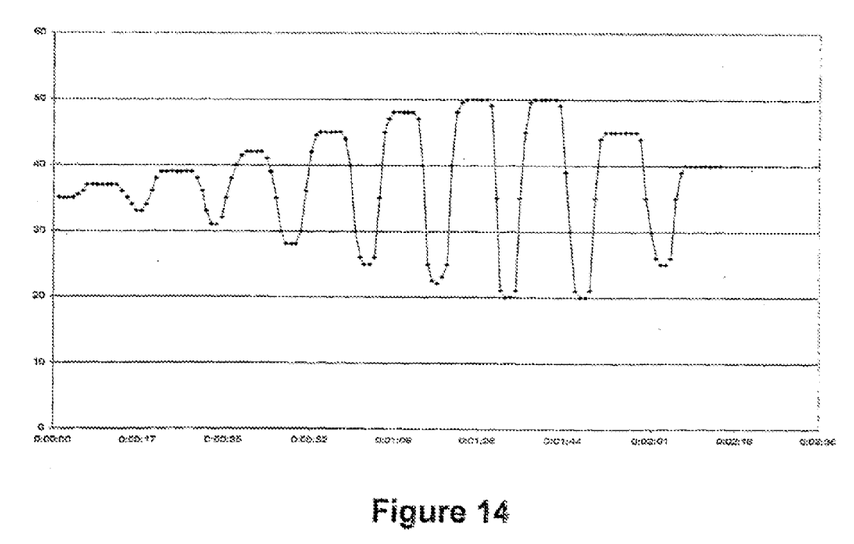
FIG. 14 shows a fourth example, similar to the third example, with smoothed transitions.

Under the control of a user, an envelope function is applied to the steps, so as to control the step height between different steps in accordance with the envelope function. Following the application of the steps subsequent to step 52, the control data program containing a stepped envelope function together with smooth transitions, appears as in FIG. 14. Alternatively any form of envelope could be achieved by clicking and dragging the height of each peak or trough, for example by selecting a group of points at each peak or trough and then dragging them to a new position.

In reality, it is likely that in order to implement complex control data programs it may be necessary for the controller or computer to use a large number of small discretised sampling time steps (such as in the range 100 msecs to 1 second). This is performed at step 64 in FIG. 3. All of the parameters levels may be downloaded to the apparatus at each of these ultra-short steps. Enhanced levels of data buffering can be used at the apparatus in order to handle such rapidly changing parameter data.

Figure 15:
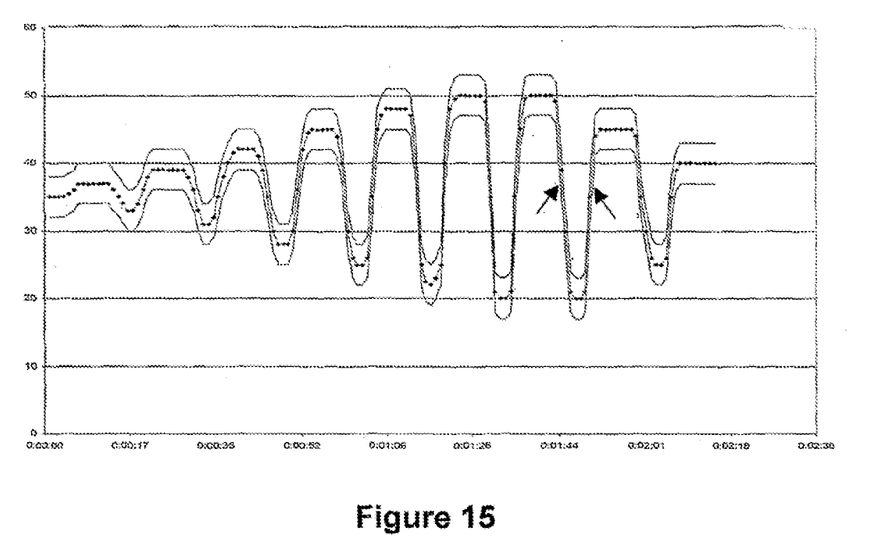
FIG. 15 shows conventional tolerance levels applied to the fourth example.

A further common problem in plasma processing, and in particular for complex multi-step recipes, is that of parameter tolerance checking. An example of the conventional tolerance levels approach when applied to the modified program according to the present invention is shown in FIG. 15. As can be seen, during the rapid transitions, the tolerance bands effectively become extremely narrow since the parameter values are changing rapidly. It is therefore likely that during periods of rapid parameter variation, as indicated by the arrows in FIG. 15, tolerance checking could fail causing either unnecessary shutdown of the system, or undesirable results.

Figure 16:
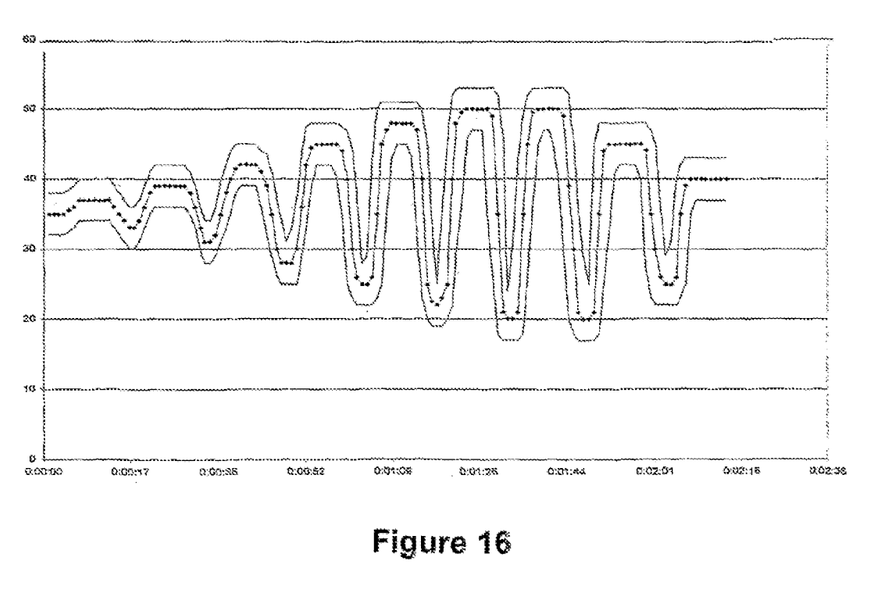
FIG. 16 shows improved tolerance levels according to a fifth example.

FIG. 16 illustrates a similar program according to the invention, with modified tolerance levels which take into account the rapid change of parameter values at certain times. Effectively, the tolerance bands are widened during such rapid changes, the amount by which this occurs being calculated in accordance with the system apparatus response time. Such calculations can be applied automatically by computer software operating on the computer 3 for example, prior to step 64 in FIG. 3. It is also envisaged that the tolerance bands may be moved by. the user, for example clicking and dragging the band levels upon a computer display such as display 4.

In this way, using the graphic representation and manipulation of the program, together with the tolerancing levels, it is possible to generate programs which produce improved results, either by ab initio recipe programming, or by the modification of known program recipes.

The invention claimed is:

1. A method of generating a control program for a plasma process, the method comprising:
    a) obtaining predetermined process data defining, in a series of time steps, changes in at least one control parameter for the plasma process during the said process, wherein the at least one control parameter is constant within each said time step;
    b) generating control data from the process data, the control data defining the at least one control parameter at a plurality of discrete times within each said time step of the series;
    c) presenting the control data graphically to a user, using an interactive display device after step (b); and
    d) modifying the control data in response to the operation by the user of the interactive display device, so as to generate the control program.

2. A method according to claim 1, wherein the data defining the at least one control parameter is data representing the value of the control parameter.

3. A method according to claim 2, wherein the data represents the magnitude of the control parameter.

4. A method according to claim 1, wherein the time steps defined by the process data are separated by discontinuities in the data.

5. A method according to claim 1, wherein step (b) further comprises defining a transition period between adjacent 30 steps and generating control data from the process data for the transition period, the control data defining values of the at least one control parameter at one or more discrete times between each step during the transition period.

6. A method according to claim 5, wherein the modification of the control data values is applied to control data values lying within the transition period.

7. A method according to claim 5, wherein the transition period is defined by shortening in time, one or each of the adjacent steps such that the transition period has a length in time related to the amount by which the step(s) was shortened.

8. A method according to claim 7, wherein the transition period has a length equal to the length reduction in the one or each adjacent steps, so as to maintain the total length of the plasma process.

9. A method according to claim 1, further comprising, the user selecting a group of two or more adjacent control data values and fitting the values to a predetermined function.

10. A method according to claim 9, wherein the predetermined function is selected from a predetermined number of such functions.

11. A method according to claim 1, further comprising, for a given value of a parameter, determining a permitted tolerance band related to the parameter for use in monitoring the performance of the plasma process.

12. A method according to claim 11, wherein the permitted tolerance band is allowed to vary through the recipe.

13. A method according to claim 11, wherein the permitted tolerance band and/or its variation is determined by a user.

14. A method according to claim 11, further comprising displaying the tolerance using the interactive display device.

15. A method according to claim 1, wherein step (d) further comprises modifying the control data values for a number of the steps in process data according to an applied envelope function.

16. A method according to claim 1, wherein the control data values include values at a time corresponding to at least the start and/or finish times of each step.

17. A method according to claim 1, wherein the process data are generated initially using the interactive display device.

18. A method according to claim 1, wherein the discrete times are regularly spaced in time.

19. A method according to claim 18, wherein the discrete times are spaced by between 100 msec and 1 second.

20. A method according to claim 1, wherein the program is further divided into values at specified sampling times.

21. A method according to claim 20, wherein the specified sampling times are regularly spaced in time.

22. A method according to claim 21, wherein the specified sampling times are spaced by no more than 100 msec.

23. A method according to claim 1, wherein the interactive display device displays the process data as a graph of the parameter on a first axis and time on a second axis.

24. A method according to claim 1, wherein the interactive display device displays the control data as a graph of the parameter on a first axis and time on a second axis.

25. A method according to claim 23, wherein the data are plotted as points upon the respective graph and wherein the user modifies the graph by selecting and moving points to desired positions, with the control data being recalculated accordingly to form the control program.

26. A method of plasma processing, comprising:
   obtaining a plasma process control program generated using a method according to claim 1; and,
   operating plasma processing apparatus in accordance with the control program, so as to perform a desired plasma process.

27. A method according to claim 26, wherein the plasma processing apparatus is controlled such that the at least one parameter is substantially the same as that required by the corresponding program at the relevant time.

28. A method according to claim 1, wherein the method is computer-implemented.

29. A program for controlling a method of plasma processing according to claim 1.

30. A computer program comprising computer program code means adapted to perform the method according to claim 1, when said program is run on a computer.

31. A computer program according to claim 30, embodied upon a computer readable medium.

32. A plasma processing system for performing a method according to claim 26, the system comprising a plasma processing apparatus for plasma processing a substrate in accordance with the control program; an interactive display device for generating the control program in accordance with the user; and a control system in communication with the plasma processing apparatus for executing the control program and controlling the plasma processing apparatus so as to perform the desired plasma process.

33. A system according to claim 32, wherein the interactive display device is a computer having an associated display and user-input device.

34. A system according to claim 32, wherein the control device comprises a programmable logic controller.

* * * * *